(12) United States Patent
Van Dyken

(10) Patent No.: US 8,513,974 B1
(45) Date of Patent: Aug. 20, 2013

(54) POWER DISTRIBUTION NETWORK NOISE REDUCTION

(75) Inventor: John Curtis Van Dyken, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/352,014

(22) Filed: Jan. 17, 2012

(51) Int. Cl.
*G06F 7/38* (2006.01)
*H03K 19/173* (2006.01)

(52) U.S. Cl.
USPC .................. 326/38; 326/15; 326/33; 326/47

(58) Field of Classification Search
None
See application file for complete search history.

(56) References Cited

U.S. PATENT DOCUMENTS

| | | | |
|---|---|---|---|
| 6,868,374 B1* | 3/2005 | Ditlow et al. | 703/18 |
| 7,595,679 B1* | 9/2009 | Popovich et al. | 327/384 |
| 8,214,781 B1* | 7/2012 | Liu et al. | 716/106 |

OTHER PUBLICATIONS

Jianping Xu, On-Die Supply-Resonance Suppression Using Band-Limited Active Damping, International Solid State Circuits Conference, Feb. 2007.

* cited by examiner

*Primary Examiner* — Anh Tran
(74) *Attorney, Agent, or Firm* — Fletcher Yoder P.C.

(57) ABSTRACT

Systems and methods for reducing power distribution network noise are provided. For example, in one embodiment, a method includes determining delay variations of a user design via a delay sensor of an integrated circuit (IC). The delay variations are associated with voltage variations of the user design. Low frequency components of the voltage variations are filtered via control logic of the IC to obtain an AC response of the user design. An artificial current load is introduced to the IC to negate the AC response of the user design.

24 Claims, 6 Drawing Sheets

POWER DISTRIBUTION NETWORK NOISE REDUCTION

BACKGROUND

The present disclosure relates generally to integrated circuits, such as field programmable gate arrays (FPGAs). More particularly, the present disclosure relates to reducing power distribution network (PDN) noise in an integrated circuit (e.g., an FPGA).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

In high-speed serial interface (HSSI) applications, a high-speed serial input signal (e.g., between approximately 6 to 12 Gbps) to a receiver (RX) of an integrated circuit (IC) device may become attenuated and distorted due to frequency-dependent signal loss across interconnects. One form of distortion that may affect the input signal is intersymbol interference (ISI), which occurs when one data bit of the serial signal interferes with a subsequent data bit. Increases in ISI may produce a measurable degradation of the input signal quality, and the margins of clock and data recovery (CDR) circuitry may be negatively affected.

Integrated circuits (ICs) take a variety of forms. For instance, field programmable gate arrays (FPGAs) are integrated circuits that are intended as relatively general-purpose devices. FPGAs may include logic that may be programmed (e.g., configured) after manufacturing to provide any desired functionality that the FPGA is designed to support. Thus, FPGAs contain programmable logic, or logic blocks, that may be configured to perform a variety of functions on the FPGAs, according to a designer's design. Additionally, FPGAs may include input/output (I/O) logic, as well as high-speed communication circuitry. For instance, the high-speed communication circuitry may support various communication protocols and may include high-speed transceiver channels through which the FPGA may transmit serial data to and/or receive serial data from circuitry that is external to the FPGA.

ICs, such as an FPGA, are typically designed to be able to operate at a target maximum operating frequency, which is often referred to as "fmax." Typically, fmax, can be achieved when clean power is supplied to the FPGA. Accordingly, an FPGA may include a power distribution network (PDN) that is tasked with providing such clean power and reference voltages to active devices on the die of the FPGA. However, as technology advances, core voltages of the FPGAs are gradually decreasing, causing an increased sensitivity of the FPGA to PDN fluctuations. Further, as the density of the FPGAs increase, the current draw from the FPGAs also increases, which may result in an increase in the magnitude of PDN fluctuations. For instance, when the current profile of the FPGA design stimulates the PDN RLC network at or close to the resonant frequency of the printed circuit board (PCB) and the device (e.g., die), current variations may cause on-chip voltage to drop, which may negatively affect fmax. Thus, resonant PDN noise that may reduce the operating frequency of FPGAs is becoming increasingly problematic, making it more challenging for FPGAs to achieve their target fmax.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for reducing PDN noise in a designer's FPGA design. In particular, the present embodiments may provide FPGAs the ability to reduce PDN noise created by a designer's FPGA design through attempting to cancel out AC current components at the resonant frequency of the printed circuit board (PCB) and the on-chip devices. For example, in one embodiment, an integrated circuit device implementing such features may be configured to detect delay variations of a designer's FPGA design, associate the delay variations with voltage variations of the designer's FPGA design, filter DC/low frequency components of the voltage variations, and introduce an artificial current load to negate the at least a portion of the AC response of the designer's FPGA design.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to circuitry for reducing PDN noise caused by AC components of a designer's integrated circuit (IC) design. In particular, IC designs that include PDN noise damper logic may result in ICs that operate more efficiently (e.g., may operate at or closer to the IC maximum operating frequency (fmax)). For instance, when the current profile of the IC design stimulates the PDN RLC network at or close to the resonant frequency of the printed circuit board (PCB) and/or the device (e.g., packaged die), current variations may cause on-chip voltage to drop, which may negatively affect fmax. In the present embodiments, the PDN noise damper logic may be configured to introduce an artificial current load, which may essentially negate an AC current at the resonant frequency of the IC, thus improving fmax performance. Certain particular examples presented below will relate to field programmable gate arrays (FPGAs). However, it should be understood that the present disclosure relates to any integrated circuits with suitable circuitry.

Figure 1:
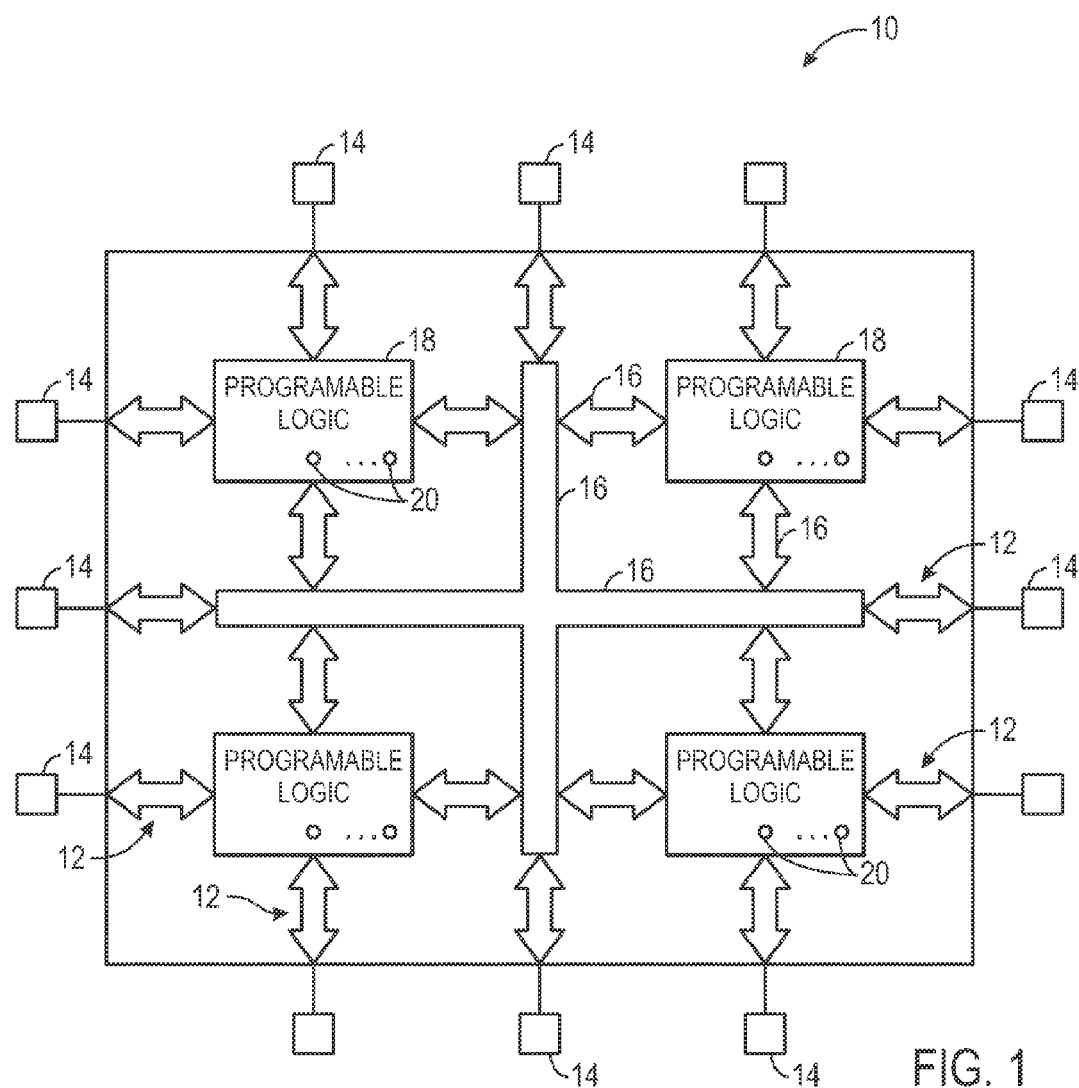
FIG. 1 is a block diagram of a programmable logic device that may include logic configured to reduce power distribution network (PDN) noise, in accordance with aspects of the present disclosure.

With the foregoing in mind, FIG. 1 illustrates an integrated circuit (IC) device 10, which may be a programmable logic device, such as a field programmable gate array (FPGA). For the purposes of this example, the device 10 is referred to as an FPGA, though it should be understood that the device may be any type of programmable logic device (e.g., an application-specific integrated circuit and/or application-specific standard product). As shown, FPGA 10 may have input/output circuitry 12 for driving signals off of device 10 and for receiving signals from other devices via input/output pins 14. Interconnection resources 16, such as global and local vertical and horizontal conductive lines and buses, may be used to route signals on device 10. Additionally, interconnection resources 16 may include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. In various embodiments, the programmable logic 18 may be configured to perform a custom logic function. The programmable interconnects associated with interconnection resources may be considered to be a part of programmable logic 18. As discussed in further detail below, the FPGA 10 may include dampening circuitry configured to detect and cancel out AC current components at resonant frequencies, which may improve FPGA operation.

Programmable logic devices, such as FPGA 10, may contain programmable elements 20 with the programmable logic 18. For example, after manufacturing, a designer (e.g., a customer) may program (e.g., configure) the programmable logic 18 to perform one or more desired functions. By way of example, some programmable logic devices may be programmed by configuring their programmable elements 20 using mask programming arrangements, which is performed during semiconductor manufacturing. Other programmable logic devices are configured after semiconductor fabrication operations have been completed, such as by using electrical programming or laser programming to program their programmable elements 20. In general, programmable elements 20 may be based on any suitable programmable technology, such as fuses, antifuses, electrically-programmable read-only-memory technology, random-access memory cells, mask-programmed elements, and so forth.

Most programmable logic devices are electrically programmed. With electrical programming arrangements, the programmable elements 20 may be formed from one or more memory cells. For example, during programming, configuration data is loaded into the memory cells 20 using pins 14 and input/output circuitry 12. In one embodiment, the memory cells 20 may be implemented as random-access-memory (RAM) cells. The use of memory cells 20 based on RAM technology is described herein is intended to be only one example. Further, because these RAM cells are loaded with configuration data during programming, they are sometimes referred to as configuration RAM cells (CRAM). These memory cells 20 may each provide a corresponding static control output signal that controls the state of an associated logic component in programmable logic 18. For instance, in some embodiments, the output signals may be applied to the gates of metal-oxide-semiconductor (MOS) transistors within the programmable logic 18.

The circuitry of FPGA 10 may be organized using any suitable architecture. As an example, the logic of FPGA 10 may be organized in a series of rows and columns of larger programmable logic regions, each of which may contain multiple smaller logic regions. The logic resources of FPGA 10 may be interconnected by interconnection resources 16 such as associated vertical and horizontal conductors. For example, in some embodiments, these conductors may include global conductive lines that span substantially all of FPGA 10, fractional lines such as half-lines or quarter lines that span part of device 10, staggered lines of a particular length (e.g., sufficient to interconnect several logic areas), smaller local lines, or any other suitable interconnection resource arrangement. Moreover, in further embodiments, the logic of FPGA 10 may be arranged in more levels or layers in which multiple large regions are interconnected to form still larger portions of logic. Still further, other device arrangements may use logic that is not arranged in a manner other than rows and columns.

As discussed above, the FPGA 10 may allow a designer to create a customized design capable of executing and performing customized functionalities. Typically, a given FPGA design may have a unique current profile that may create PDN noise on the FPGA 10 under certain circumstances. For instance, when the current profile of the FPGA design stimulates certain AC current frequencies, such as resonant frequencies, voltage swings may occur, which may affect fmax performance of the FPGA 10. This is described in more detail in FIG. 2

Figure 2:
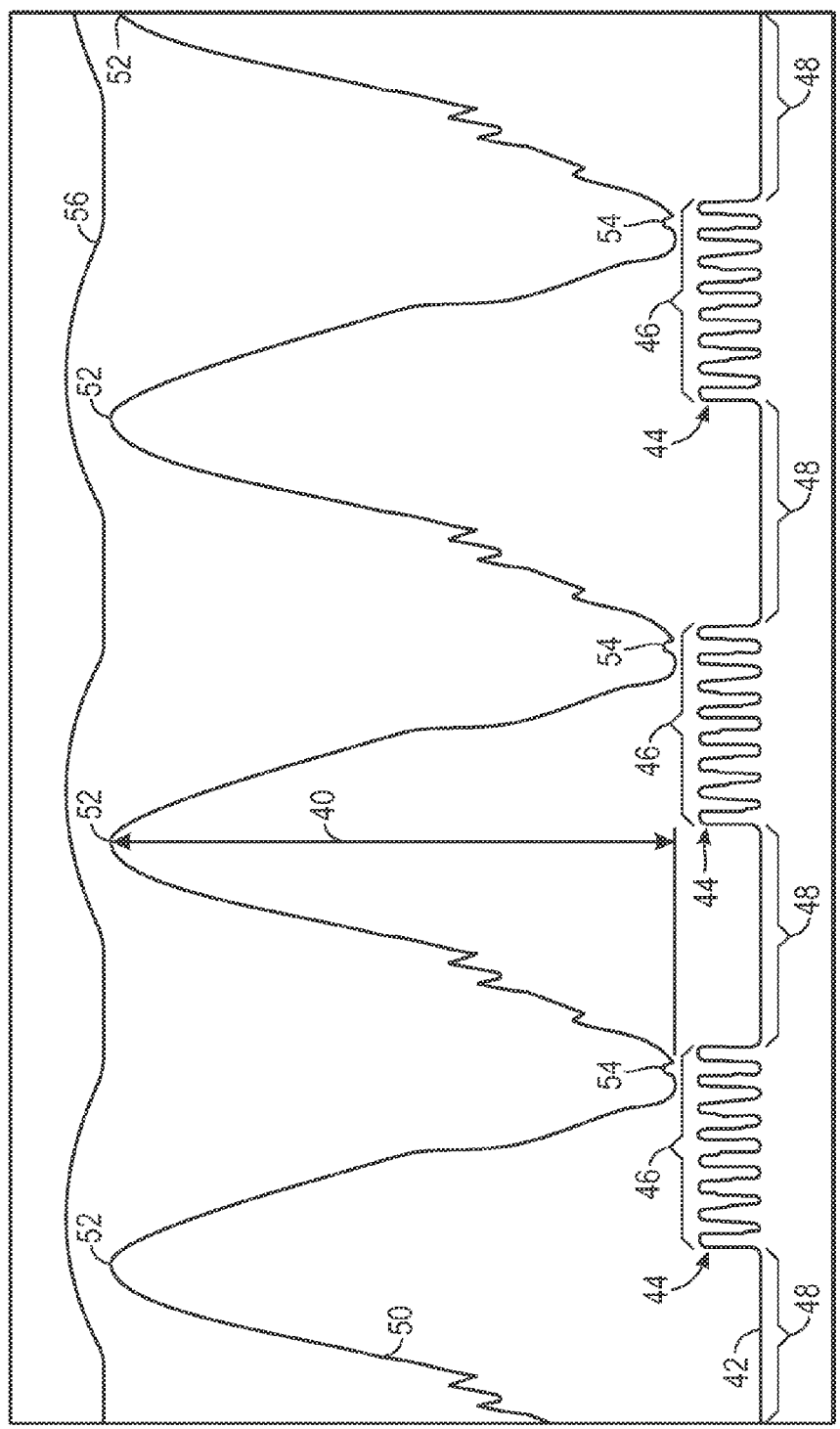
FIG. 2 is a representation of an on-chip voltage swing produced by current stimulus for a designer's FPGA design.

Referring now to FIG. 2, a timing diagram is provided and illustrates an on-chip voltage swing 40 that may be the result of current stimulus 42 corresponding to a given FPGA design. As illustrated in FIG. 2, in some designs, current stimulus 42 in the form of a periodic burst pattern 44 may result. For example, the periodic burst pattern 44 is defined as a pattern of bursts of circuit switching 46 following idle states 48. When the periodic burst pattern 44 repeats at the PDN resonant frequency, it may maximally stimulate and reinforce the current resonating between the on-die capacitance and system loop inductance, including the package and PCB, due to its parallel inductive and capacitive resonant circuit nature. For instance, the PDN may be modeled as an equivalent RLC circuit.

As shown in the present example, the on-chip voltage 50 begins to drop as current is drawn from the periodic bursts 46. At the end of each periodic burst 46, when the circuit returns to an idle state 48, there may be an abrupt current change. This may cause a strong inductive overshoot in which the on-chip voltage increases, which may result in a large on-chip voltage swing 40, as shown in FIG. 2. When the next periodic burst 46 occurs, the on-chip voltage drops and recovers in the same manner, and this process may repeat as long as the periodic bursts 46 continue.

As can be appreciated, when the current simulates the PDN RLC network in such a way that the periodic burst pattern 44 repeats at or near a resonant frequency (e.g., the resonant frequency of the printed circuit board (PCB) and the device (e.g., die)), this is generally considered to be a worst-case condition of PDN stimulus, which causes the strongest on-chip voltage swings 40 and also causes the on-chip voltage to oscillate, as shown in FIG. 2. These strong voltage swings 40 may produce timing violations such as hold violations at the voltage peaks 52 or setup violations at the voltage troughs 54. Accordingly, since fmax may be directly impacted by the on-chip voltage 50, a drop in the on-chip voltage 50 may reduce fmax of the FPGA. Further, a PCB voltage 56 may be affected in a similar manner, shown in FIG. 2.

In accordance with the presently disclosed techniques, to counteract the strong voltage swings 40 that may occur in an FPGA design due to PDN noise, dampening circuitry may be incorporated into the FPGA 10. For example, the dampening circuit may enable a cancellation of AC current component at the resonant frequency. This may reduce the occurrence of the voltage swings 40, thus improving the fmax performance of the FPGA 10.

Figure 3:
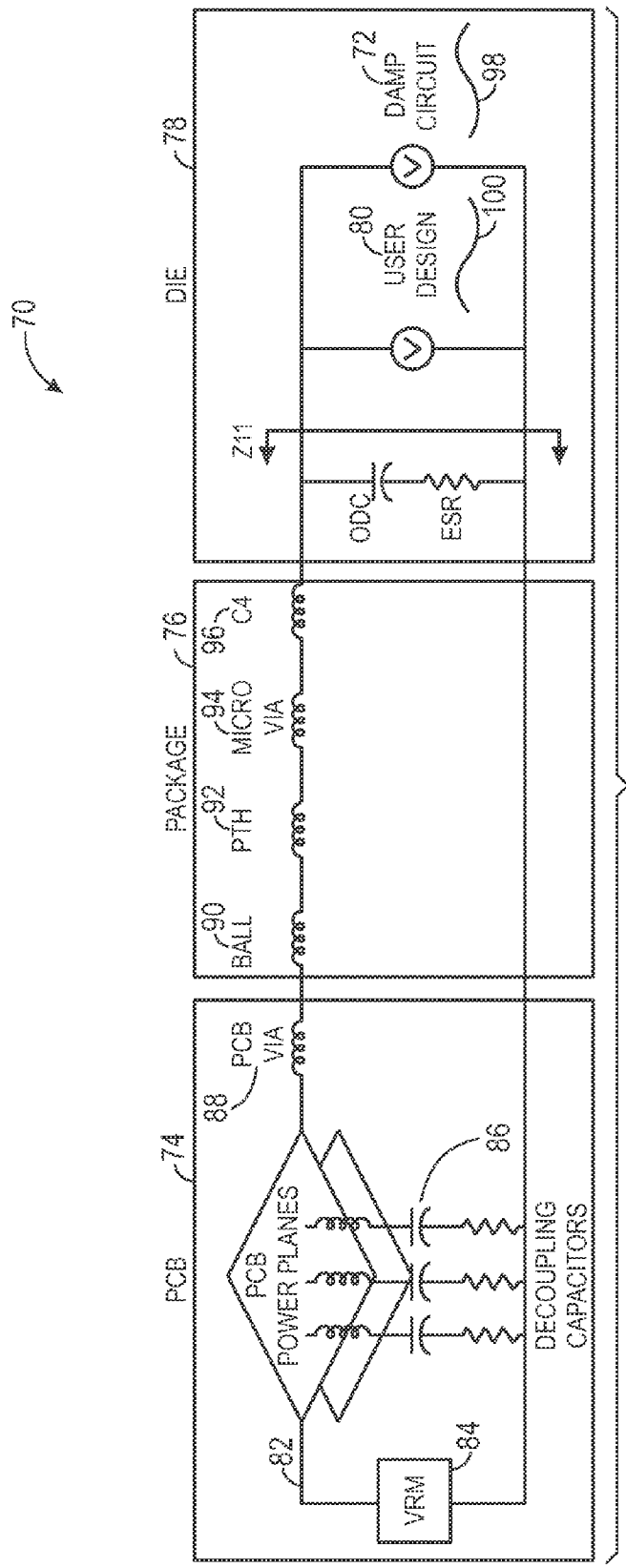
FIG. 3 is a circuit model of a PDN with dampening circuitry, in accordance with an embodiment.

FIG. 3 illustrates a circuit model 70 of a PDN 71 with dampening circuitry 72, in accordance with an embodiment. The circuit model 70 includes equivalent circuits for a typical PDN system, which may include a printed circuit board (PCB) 74, a package 76, and a die or chip 78. The printed circuit board 74 may mechanically support and electrically connect components of the FPGA 10. The package, or chip carrier, 76 generally functions as carrier for the die 78. For example, the package 76 may provide metal leads which electrically and mechanically couple the die to the printed circuit board 74. The die 78 may include functional circuitry enabled to implement a designer's FPGA design 80 stored in programmable logic 18 (e.g., logic array blocks (LABs)).

As described above, the PDN 71 may be tasked with providing clean power and reference voltages to the active devices on the die 78. For example, in one embodiment, the PCB portion 74 of the PDN 71 may include a voltage regulator module 84, decoupling capacitors 86, and PCB vias 88 at the PCB 74. PDN 71 may provide power to the die 78 over power rails 82 from the voltage regulator module 84. In one embodiment, the package portion 76 may include balls 90, plated-through-holes (PTH) 92, vias 94, and chip bumps 96. As can be appreciated, the balls 90, plated-through-holes 92, vias 94, and chip bumps 96 may, collectively, electrically couple the PCB 74, package 76, and die 78 together. Accordingly, the PDN 71 may provide power (e.g., via power rails 82) to the electrically coupled die 78 elements, which may include the user design logic 80 (e.g., programmable elements 20 of the FPGA 10 programmed with a user's design) and the dampening circuitry 72.

As previously discussed, the dampening circuitry 72 may be configured to cancel out AC current components in the user design 80 at the resonant frequency. As will be discussed in more detail below, the dampening circuitry 72 may, upon detecting delay variations in the core of the FPGA (e.g., may be indicative of PDN noise), be configured to implement dynamic loading by injecting an artificial load 98 that is equal and opposite to the current load (e.g., AC response 100) of the user design 80. While the use of the artificial load 98 may increase power consumption by activating certain portions of logic, which may increase the current load of the die 78, the use of the artificial load 98 may substantially cancel out the AC response 100 at the resonant frequency. This may result in improved operating efficiency of the FPGA 10, such as improved fmax utilization. Thus, as can be appreciated, the decision to implement the dampening circuit 72 may be viewed as a design tradeoff between increased power consumption and improved fmax utilization.

Figure 4:
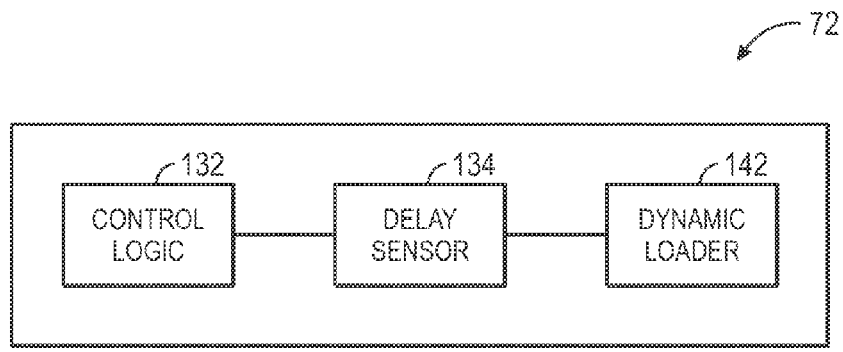
FIG. 4 is a block diagram illustrating the dampening circuitry shown in FIG. 3 in more detail, in accordance with an embodiment.
Figure 5:
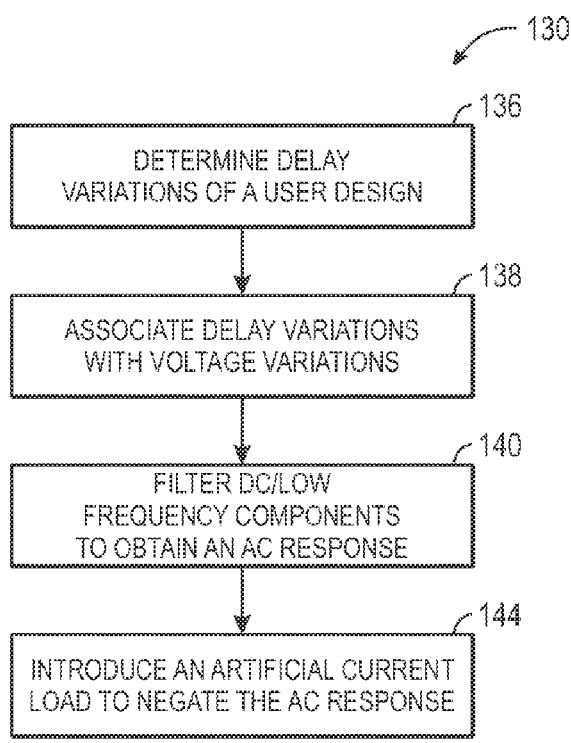
FIG. 5 depicts a flowchart illustrating a process for detecting and reducing PDN noise in an FPGA device, in accordance with an embodiment of the present disclosure.

Next, FIG. 4 illustrates a block diagram of dampening circuitry 72 from FIG. 3, in accordance with an embodiment of the present disclosure. Further, FIG. 5 illustrates a flowchart showing a PDN noise reduction process 130, in accordance with an techniques described above. To better illustrated the operation of the dampening circuitry 72, FIGS. 4 and 5 will be described concurrently below.

As shown in FIG. 4, the dampening circuitry 72 may include control logic 132 that may be configured to function as a high pass filter. As will be described in more detail below with respect to FIG. 6, the filtered electrical signal is supplied to a delay sensor 134, which may be configured to detect relative delay variations in the core of the FPGA (block 136). The delay sensor 134 may also associate the delay variations with die voltage variations (block 138). The control logic 132 may filter out DC/Low frequency components of the delay sensor 134 to determine an AC response from the user's FPGA design 80 (block 140). The dynamic load circuitry 142 may introduce an artificial load 98 (FIG. 3) that essentially negates (e.g., is substantially equal and opposite to) the AC response 100 determined by the control logic 132 (block 144). In this manner, the PDN noise is reduced, allowing for improved operation of the FPGA 10.

The control logic 132 may be configured to provide specific control parameters for the dampening circuitry 72. For example, as discussed above, the DC/low frequency current fluctuations may be filtered to provide the AC response. This may help to ensure that the dampening circuitry 72 does not draw more power than necessary to damp the AC response of the user's FPGA design 80. Further, the control logic 132 may provide a power down interface that enables a user to disable the dampening circuitry 72 functionality at certain times. For example, the designer may desire to utilize more power to meet fmax during certain times (e.g., enabling the dampening circuitry 72), while opting to conserve power during other times (e.g., disabling the dampening circuitry 72), such as in applications were power usage is more critical. Accordingly, the control logic 132 may provide the power down interface to facilitate such functionality. The control logic 132 also ensures that the artificial load 98 remains within a prescribed operating range. As will be discussed in more detail below, the operating range and other control logic variables may be prescribed and configured using design software for programmable logic devices, such as FPGAs. One example of such design software may be a version of Quartus®, available from Altera Corporation.

As discussed above, the delay sensor 134 includes circuitry that may be configured to detect for delay variations in the die (e.g., on-chip) voltage 50. For example, the delay sensor 134 may be implemented using programmable logic 18 resources of the FPGA 10 or may be included as dedicated circuitry (e.g., a dedicated block of logic that is fixed to this function at manufacturing) on the FPGA 10. In one embodiment, the delay sensor 134 may include high bandwidth circuitry, as the performance of the dampening circuitry 72 may depend on the speed at which delay variations are detected.

Figure 6:
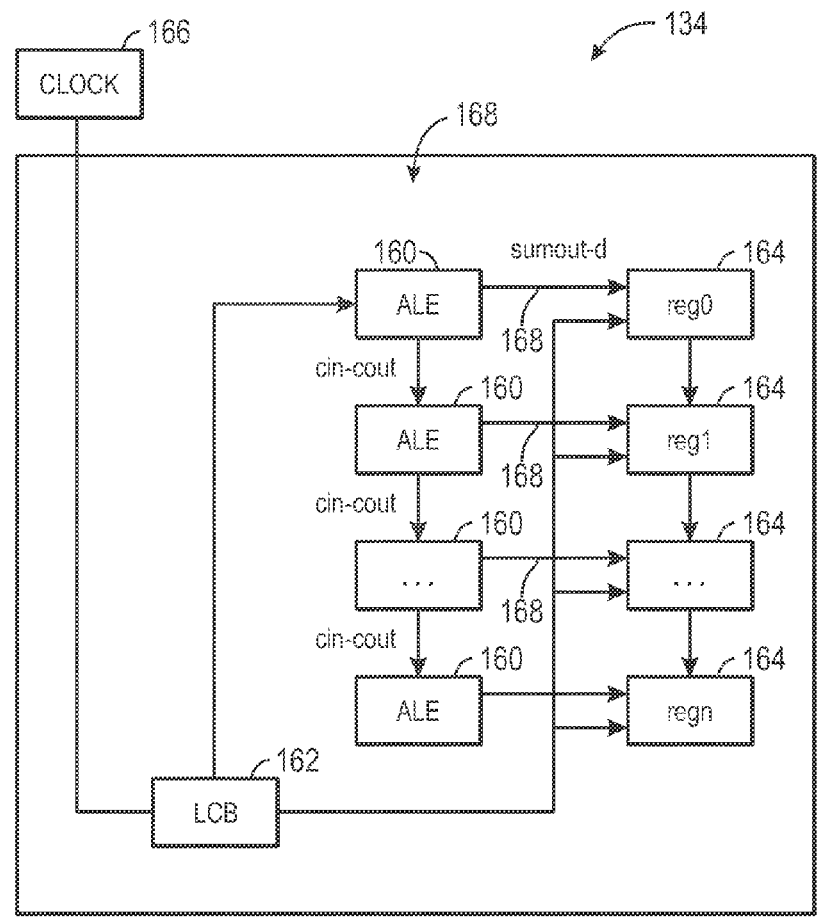
FIG. 6 is a block diagram showing an embodiment of the delay sensor that may be implemented in the dampening circuitry of FIG. 4, in accordance with an embodiment.

FIG. 6 illustrates an embodiment of a delay sensor 134 that may be prototyped in a programmable logic 18 of an FPGA, which may be a model of a Stratix® FPGA 10, by Altera Corporation of San Jose, Calif., in one embodiment. As shown, the delay sensor 134 may include programmable elements (e.g., 2 bit address latch enable (ALEs) elements 160), routing circuitry (e.g., lab control block 162), and registers 164. The clock signal 166 is routed through a carry chain 168 of the programmable elements 160. Further, the clock signal 166 is routed to the registers 164. This setup essentially establishes a race condition. For instance, if the a respective signal 168 from the programmable elements 160 reaches its respective register 164 either before or at the same time a respective clock signal 166 reaches the respective register 164, the respective register 164 may be configured to store a value of "1". If the respective signal 168 from the programmable elements 160 in the carry chain 168 does not reach its respective register 164 when the respective clock signal 166 reaches the respective register 164, the register 164 may be configured to store a "0". Each register 164 may be configured in this manner.

Thus, the speed of the die directly impacts the number of "1's" and "0's" that are stored in the registers. That is, the speed of traversing the carry chain 168, and thus the speed of the die 78, may be determined by counting the "1's" and "0's" in the registers 164. For example, a large number of "1's" in the registers 164 may be indicative of relatively fast operation of the die 78, which may be interpreted as few delay variations. However, a large number of "0's" may indicate slower operation of the die 78 due to a higher number of delay variations. As can be appreciated, the control logic 132 may be configured to detect for a particular number of "0's" to determine whether to enable the dampening circuitry 72.

Referring again to FIG. 4, the dynamic load circuitry 142 may be configured to receive the AC response 100 from the control logic 132. As previously discussed, the dynamic load circuitry 142 may introduce an artificial current load 98 to the FPGA 10 to offset the AC response 100. To respond to current fluctuations, it may be desirable for the dynamic load circuitry 142 to respond very quickly. Thus, it may be beneficial to keep the dynamic load circuitry 142 spatially close to the delay sensor logic 134 to decrease transfer latency. The dynamic load circuitry 142 may create the artificial current load 98 in numerous ways. For instance, in one embodiment, ring oscillators may be utilized to generate the artificial current load 98. For example, the ring oscillators may utilize a simple lookup table providing frequency values (e.g., in Ghz) for the artificial current load 98. Further, when generating the artificial current load 98, the use of high frequency components may be beneficial, as less area (e.g., programmable logic 18) may be required to generate the artificial current load 98. This may help to at least partially mitigate the extra power consumed when utilizing the artificial current load 98.

By way of example only, in a prototype implemented on the Stratix IV® FPGA from Altera Corporation, the dampening circuitry 72 was found to significantly reduce the delay variation at the resonant frequency of the die 78. In the prototype, the dampening circuitry 72 was implemented using multiple programmable logic elements packaged in adaptive logic modules (ALM)s, which may be arranged in a logic array block (LAB). For instance, in some embodiments, the dampening circuitry 72 may be implemented using a number of LABs that corresponds to less than 1 percent of the programmable logic 18 resources of the FPGA 10.

Figure 7:
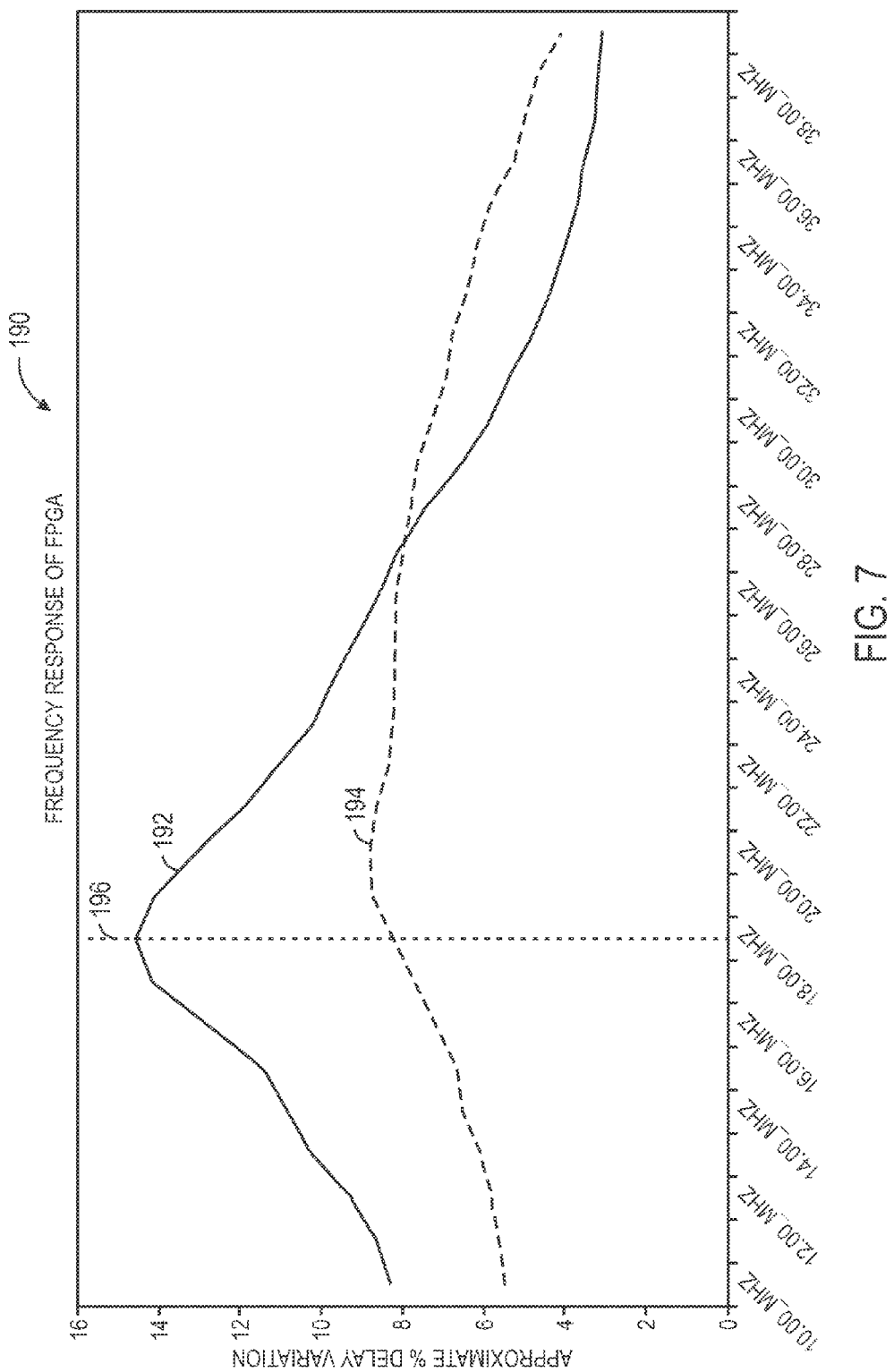
FIG. 7 is a chart comparing delay variations across various frequencies for an FPGA that includes dampening circuitry in accordance with embodiments of the present disclosure, and an FPGA that does not include the dampening circuitry.

FIG. 7 illustrates examples of measured results of a prototype FPGA with the dampening circuitry 72. For instance, the chart 190 depicted in FIG. 7 provides a comparison of frequency response measurements 192 of an FPGA 10 without dampening circuitry 72 and frequency response measurements 194 of an FPGA 10 that includes the dampening circuitry 72. In this particular example, an approximate current load of 500 milli-amperes (mA) at the resonant frequency 196 generated an approximately 14% delay variation. The dampening circuitry 72 in this example utilized a peak of 500 mA and an average of approximately 250 mA to negate the AC response 100. The dampening circuitry 72 reduced the delay variation to approximately 9% at the resonant frequency 196.

As can be further appreciated FPGA design software, such as Quartus® from Altera Corporation, may enable programming of intellectual property (IP) cores into the FPGA 10 (e.g., data streams containing configuration information). For instance, one IP-core may include the dampening circuitry 72 discussed above. The FPGA design software may also include a user interface (e.g., a wizard) that allows a user to easily incorporate the dampening circuitry 72 into the user's FPGA design 80. For example, the FPGA software may include a drag and drop interface that allows a designer to incorporate a dampening circuitry 72 IP-core into an FPGA design 80 simply by selecting the dampening circuitry 72 in the design software and moving it into the FPGA logic. The FPGA software may additionally include functionality to model PDN resonance. For example, to model the PDN resonance, the FPGA may receive a simulation vector provided by the user. The PDN resonance model may be used by the FPGA software to determine the worst case voltage drop, as discussed above. The PDN resonance model may also be used by the FPGA design software to configure the resulting dampening circuitry 72. For example, the FPGA software may configure the control logic 132 to target specific frequency ranges or to calculate the artificial loads 98 required to obtain a particular fmax.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A method to reduce power distribution network resonance in an integrated circuit (IC), said method comprising:
   determining delay variations of a user design using a delay sensor;
   associating the delay variations with voltage variations of the user design; and
   introducing an artificial current load to the IC, wherein the artificial current load configured to negate the AC response of the user design.

2. The method of claim 1, comprising filtering low frequency components of the voltage variations via control logic of the IC to obtain an AC response of the user design.

3. The method of claim 1, wherein introducing the artificial current load comprises introducing an artificial current load that is substantially equal to and opposite of the AC response.

4. The method of claim 1, wherein the AC response comprises a periodic burst pattern.

5. The method of claim 4, wherein the periodic burst pattern repeats at a resonant frequency of the power distribution network.

6. The method of claim 1, wherein determining the delay variations comprises determining a speed of traversal of a clock signal sent through a carry chain of the delay sensor.

7. The method of claim 1, wherein introducing the artificial current load comprises using one or more high-frequency ring oscillators to generate the artificial current load.

8. An integrated circuit (IC) device comprising:
programmable logic configured to store a programmable design, wherein the programmable design is configured to implement customized functions on the IC device; and
dampening circuitry comprising:
a delay sensor configured to determine voltage variations of the programmable design by detecting delay variations of the programmable design;
control logic configured to determine an AC response of the programmable design by filtering low frequency components of the determined voltage variations; and
dynamic load circuitry configured to substantially negate the AC response of the programmable design by introducing an artificial current load to the IC device.

9. The IC device of claim 8, wherein the programmable logic comprises the dampening circuitry.

10. The IC device of claim 9, wherein the dampening circuitry comprises a configuration data stream configured by programmable logic design software.

11. The IC device of claim 8, wherein the dampening circuitry comprises dedicated circuitry separate from the programmable logic.

12. The IC device of claim 8, wherein at least one of the delay sensor, control logic, or the dynamic load circuitry comprise hard logic in the IC device.

13. The IC device of claim 8, wherein the delay sensor comprises:
programmable elements configured in a carry chain; and
routing circuitry configured to provide a clock signal of the IC device through a first route to the carry chain and through a second route to each of a set of registers of the delay sensor;
wherein each register in the set of registers is configured to store a first value when the clock signal routed through the first route reaches the register at least concurrently with when the clock signal routed through the second route reaches the register, and is configured to store a second value when the clock signal routed through the second route reaches the register before the clock signal routed through the first route.

14. The IC device of claim 13, wherein the delay sensor detects the delay variations of the IC device by determining the number of second values stored in the set of registers.

15. The IC device of claim 8, wherein the dynamic load circuitry is disposed spatially close to the delay sensor to reduce transfer latency from the delay sensor to the dynamic load circuitry.

16. The IC device of claim 8, wherein the dynamic load circuitry comprises ring oscillators configured to provide the artificial current load.

17. The IC device of claim 8, wherein the control logic comprises a power down interface configured to selectively enable and disable the dampening circuitry at specific times.

18. The IC device of claim 8, wherein the control logic is configured to generate an artificial current load within a specific operating range.

19. The IC device of claim 8 comprising a field-programmable gate array (FPGA).

20. A tangible computer-readable medium, comprising instructions to:
provide a programmable logic interface for an integrated circuit (IC), the programmable logic interface being configured to enable a designer to implement an IC design in programmable-logic of the IC; and
provide a dampening interface to incorporate dampening circuitry into the programmable-logic of the IC, wherein the dampening circuitry is configured to negate an AC response of the IC design implemented in the programmable logic interface.

21. The tangible computer-readable medium of claim 20 comprising instructions to:
model a power distribution network resonance of the IC design; and
determine a worst-case voltage drop of the IC design, based at least in part upon the power distribution network resonance.

22. The tangible computer-readable medium of claim 21 comprising instructions to:
configure control logic of the dampening circuitry to target at least one of specific frequency ranges based at least in part upon the power distribution network resonance.

23. The tangible computer-readable medium of claim 22, wherein the instructions for configuring the control logic comprise instructions for calculating an artificial load suitable for negating the AC response.

24. The tangible computer-readable medium of claim 20, wherein the dampening interface comprises a drag and drop graphical user interface configured to allow a user to drag and drop the dampening circuitry into the IC design.

* * * * *